United States Patent
Rodrigues et al.

(10) Patent No.: US 8,384,126 B2
(45) Date of Patent: Feb. 26, 2013

(54) LOW VOLTAGE PNPN PROTECTION DEVICE

(75) Inventors: Richard Rodrigues, Goring-on-Thames (GB); Johnny Chen, Chicago, IL (US); Ethan Kuo, Chicago, IL (US)

(73) Assignee: Littelfuse, Inc., Chicago, IL (US)

( * ) Notice: Subject to any disclaimer, the term of this patent is extended or adjusted under 35 U.S.C. 154(b) by 0 days.

(21) Appl. No.: 13/164,690

(22) Filed: Jun. 20, 2011
(Under 37 CFR 1.47)

(65) Prior Publication Data
US 2012/0256231 A1  Oct. 11, 2012

Related U.S. Application Data

(60) Provisional application No. 61/357,373, filed on Jun. 22, 2010.

(51) Int. Cl.
*H01L 29/74* (2006.01)
(52) U.S. Cl. .......... 257/173; 257/E21.388; 257/E29.211
(58) Field of Classification Search .................. 257/173, 257/E21.388, E29.211
See application file for complete search history.

(56) References Cited

U.S. PATENT DOCUMENTS

| 5,880,511 A | 3/1999 | Yu et al. |
| 6,459,133 B1 * | 10/2002 | Brown et al. ............. 257/497 |
| 2001/0017389 A1 | 8/2001 | Hurkx et al. |
| 2003/0038340 A1 | 2/2003 | Einthoven et al. |

* cited by examiner

*Primary Examiner* — Zandra Smith
*Assistant Examiner* — Paul Patton
(74) *Attorney, Agent, or Firm* — Kacvinsky Daisak PLLC

(57) ABSTRACT

A low voltage protection device that includes a silicon substrate comprises an inner layer of a first dopant type. The device also includes a first outer layer of a second dopant type disposed adjacent a first surface of the inner layer and a second outer layer of the second dopant type disposed adjacent a second surface of the inner layer opposite the first surface. The device further includes a first mesa region disposed in a peripheral region of a first side of the low voltage protection device. The first mesa region includes a first area that includes a peripheral portion of a cathode of the low voltage protection device, the cathode formed by diffusing a high concentration of dopant species of the first type on a first surface of the silicon substrate, and a second area comprising a high concentration of diffused dopant species of the second type.

16 Claims, 5 Drawing Sheets

LOW VOLTAGE PNPN PROTECTION DEVICE

BACKGROUND OF THE INVENTION

1. Field of the Invention

Embodiments of the invention relate to the field of circuit protection devices. More particularly, the present invention relates to a low voltage circuit protection device having a reduced breakdown voltage by separating a breakdown diode from a PNPN structure.

2. Discussion of Related Art

Circuit protection devices form an electrical connection with a component or components in a circuit to be protected. Certain of these protection devices are used to protect circuits from overvoltage transients when a voltage spike occurs. One type of device used for overvoltage protection is a Zener diode which is designed to have a specific reverse breakdown voltage which is the conduction voltage when the diode is reverse biased. This is controlled by doping of the p-n junction allowing electrons to tunnel from the p-type material to the n-type material. Another type of overvoltage protection device is an avalanche diode which operates at avalanche breakdown when an overvoltage condition occurs. Although Zener and avalanche diodes provide a simple voltage transient protection device, the maximum current through the reverse junction is limited by power dissipation.

FIG. 1 illustrates an exemplary prior art protection device 10 using a breakdown diode coupled to a PNPN structure. In particular, an N-type slice 12 is disposed between p-type diffusion layers 13, 14 and an N+ cathode 15 is disposed on p-type diffusion layer 14. This device also includes a buried N-type diffusion layer 16 within N-type slice 12 and metal layer 18. When a voltage is applied to device 10, the buried diode section breaks down and current flows beneath the N+ cathode 15 as indicated by the breakdown current path at 17. Once the N+ cathode 15 becomes forward biased, the PNPN structure switches on to a low voltage state. Although this device structure works well for protection voltages above about 50V, it does not work as well for lower voltages since the heavy doping of the buried N region 16 within the PNP transistor reduces the transistor gain preventing the device from switching on easily.

FIG. 2 illustrates an exemplary prior art protection device 20 that can accommodate a breakdown voltage of about 8V. In this configuration, the breakdown diode is separated from the PNPN structure. In particular, an N-type slice 22 is disposed between p-type diffusion layers 23, 24 and N+ cathodes are disposed on p-type diffusion layer 24. A high concentration p-type diffusion 26 is disposed on a buried N-type diffusion 27 to provide junction breakdown. The breakdown current path is indicated at 28. Because the breakdown diode is separated from the PNPN structure, much higher doping concentrations may be used in the breakdown diode without compromising the switching characteristics of the PNPN structure. This allows the breakdown voltage of the device 10 to be reduced to about, for example, 8V.

However, for certain protection applications even lower breakdown voltages are required. For example, circuits used to protect certain data lines require voltages lower than 8V. As shown in FIG. 3, each of a plurality of low voltage protection devices $31_1 \ldots 31_N$ is disposed between a respective data line $30_1 \ldots 30_N$ and ground 35 to protect an integrated circuit (IC) 32. In addition, protection for LED lamps which are configured in series also require lower breakdown voltages. This is particularly important since if one of the LED's in the series fails creating an open circuit in the series, the remaining LED's will not receive current rendering them inoperative. This problem may be overcome as shown in FIG. 4 by utilizing a plurality of low breakdown voltage protection devices $40_1 \ldots 40_N$ across corresponding LED's $41_1 \ldots 41_N$ connected in series. In this manner, if a particular one of the LED's $41_1 \ldots 41_N$ fails the corresponding low voltage protection device $40_1 \ldots 40_N$ will allow current to flow to the remaining LED's in the series. For example, if LED $41_{N-1}$ fails, corresponding low voltage protection device $40_{N-1}$ allows current to flow to remaining LED $40_N$. In this configuration, the switching voltage of each of the protection devices $40_1 \ldots 40_N$ should be above the running voltage of the corresponding LED $41_1 \ldots 41_N$. By way of example, a minimum breakdown voltage of about 5V and a maximum of about 7V allows an associated LED driver circuit to supply enough voltage to switch the respective protection device into conduction. Unfortunately, fabrication processes used to manufacture IC's with breakdown voltages in these ranges are complicated as well as costly. Thus, there is a need for a discrete low voltage protection device that is less costly to manufacture, but that still satisfies desired reliability requirements.

SUMMARY

A low voltage protection device that includes a silicon substrate includes an inner layer of a first dopant type, a first outer layer of a second dopant type disposed adjacent a first surface of the inner layer, and a second outer layer of the second dopant type disposed adjacent a second surface of the inner layer opposite the first surface. The device also includes a first mesa region disposed in a peripheral region of a first side of the low voltage protection device. The first mesa region includes a first area that contains a peripheral portion of a cathode of the low voltage protection device, the cathode formed by a high concentration of diffused dopant species of the first type on a first surface of the silicon substrate. The first mesa region also includes a second area containing a high concentration of diffused dopant species of the second type.

In another embodiment, a method of forming a low voltage PNPN protection device comprises providing first and second P type layers on a respective first and second side of an N type silicon substrate to form a PNP stack. The method also includes etching a first mesa in a peripheral region of a first side of the PNP stack and diffusing a high concentration of N type dopant species in a masked process to form a cathode on the first side of the PNP stack, wherein a peripheral portion of the cathode is formed in the first mesa. The method further includes diffusing a high concentration of p type dopant species to form a P type region in the first mesa adjacent the peripheral portion of the cathode.

DESCRIPTION OF EMBODIMENTS

Figure 1:
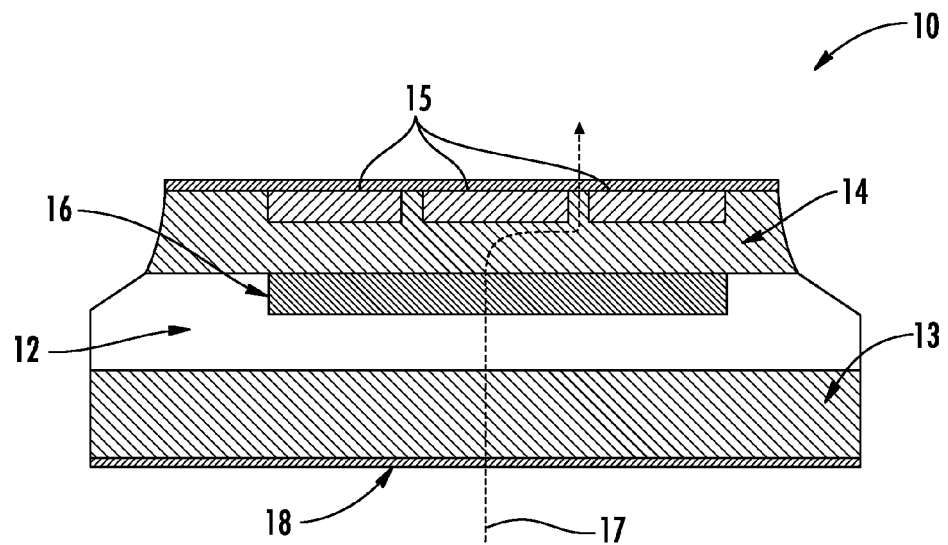
FIG. 1 illustrates an exemplary prior art protection device.
Figure 2:
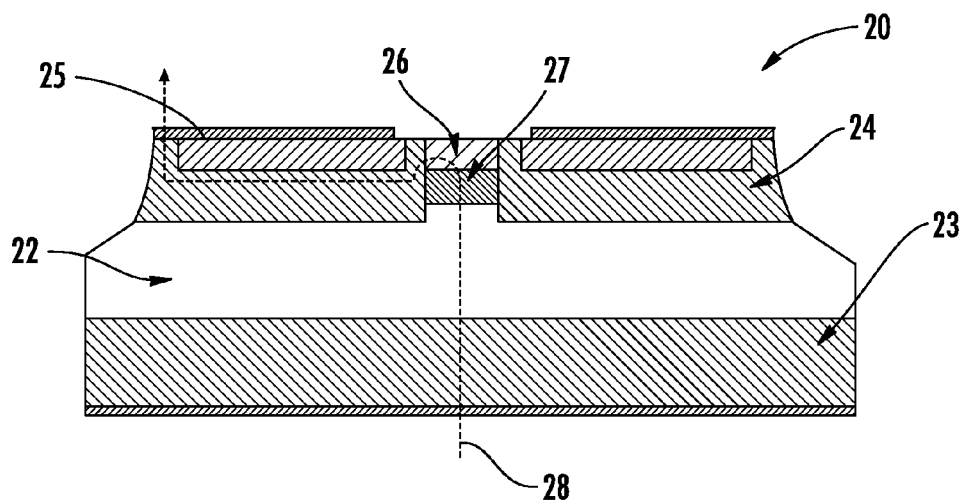
FIG. 2 illustrates an exemplary prior art protection device that can accommodate a breakdown voltage of about 8V.
Figure 3:
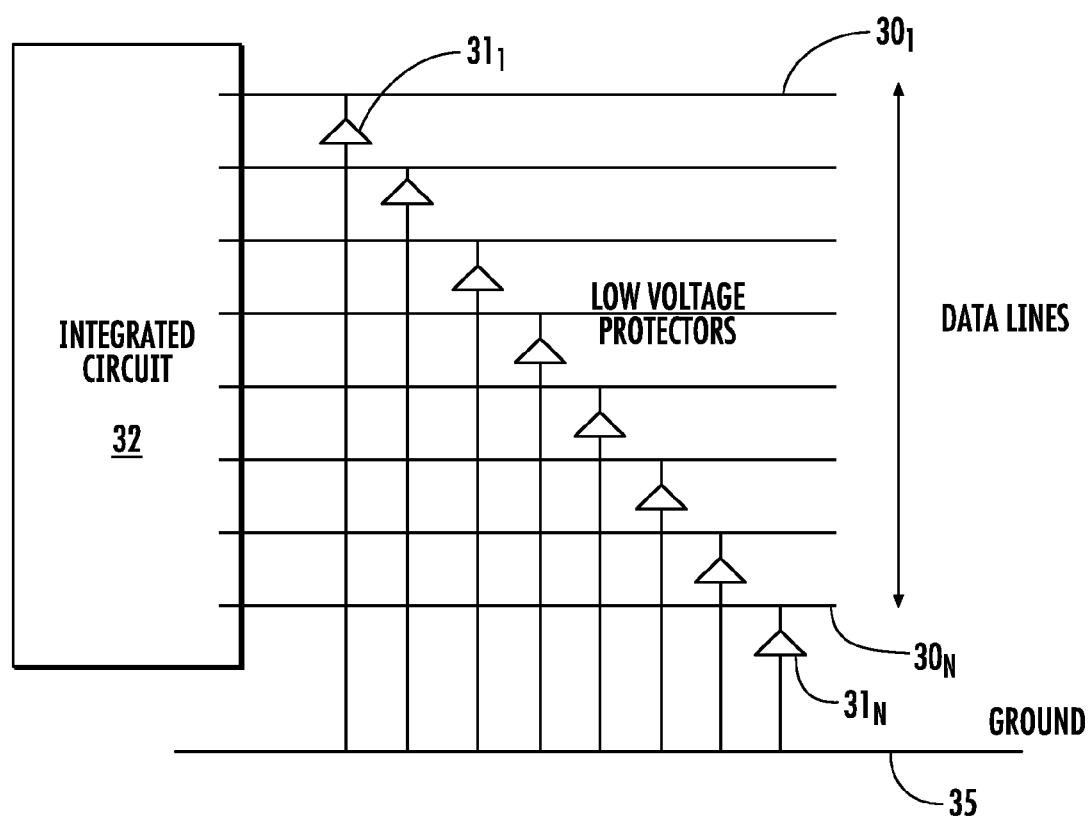
FIG. 3 illustrates an exemplary data line circuit requiring a low breakdown voltage.
Figure 4:
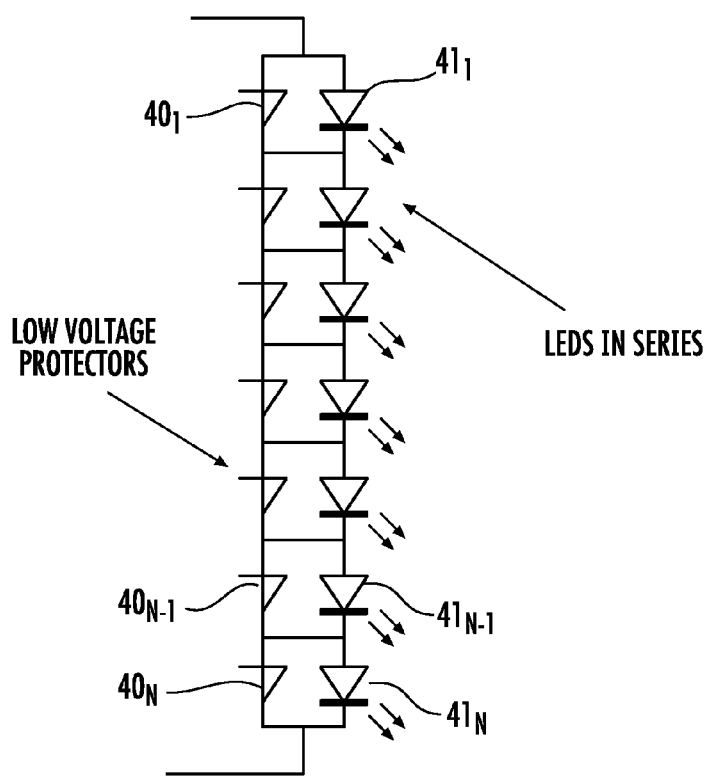
FIG. 4 illustrates an exemplary LED circuit also requiring low breakdown voltages.

The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, like numbers refer to like elements throughout.

Figure 5:
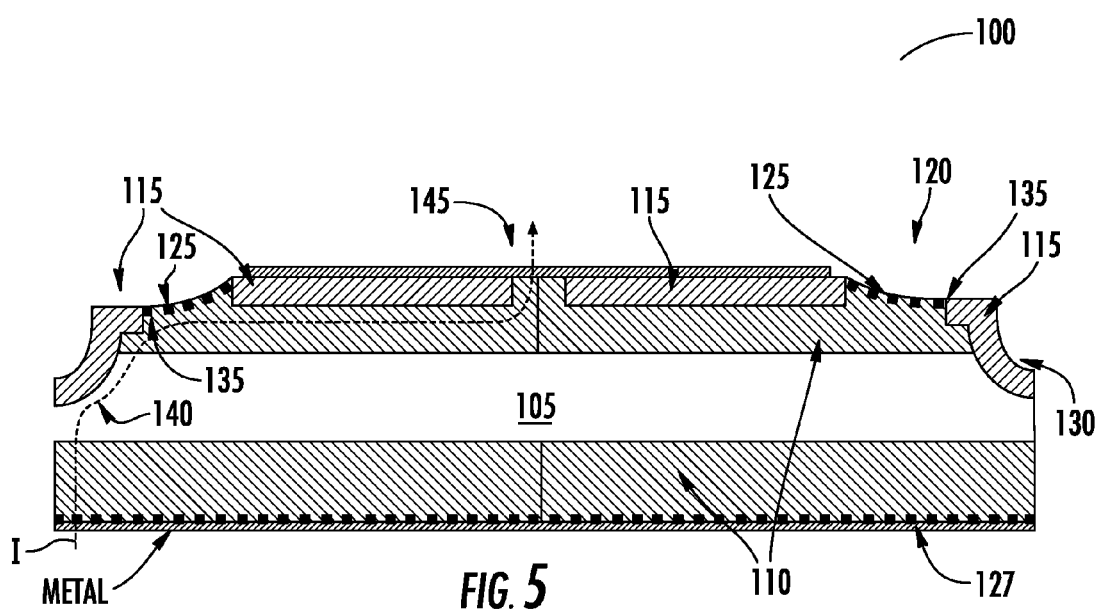
FIG. 5 illustrates a discrete low voltage protection device having a breakdown region at a mesa surface in accordance with an embodiment of the present invention.

FIG. 5 illustrates a discrete low voltage protection device 100 having a breakdown region at a mesa surface in accordance with an embodiment of the present invention. The present disclosure provides a robust low voltage protection device 100 that is less costly to fabricate which utilizes glass passivated mesa technology. In particular, device 100 includes a silicon slice 105 provided from a single crystal N type silicon ingot having P type dopant regions 110. These P type dopant regions 110 may be diffusion regions that have a depth of, for example, 30 microns. Low voltage protection device 100 includes a double mesa structure that includes a shallow mesa 120 and deep mesa 130, which may be formed by a two stage mesa etch process. Deep mesa 130 provides a contact with the N substrate region of the silicon slice 105. Formation of shallow mesa 120 removes any damage present on the slice surface. A cathode region 115 is formed using a masked diffusion process which diffuses phosphorous into the mesa region 130 and partially into the shallow mesa 120, as illustrated. A high concentration of boron with a concentration not exceeding the concentration of cathode region 115 is diffused on the top and back or bottom surfaces of the N type slice 105, forming boron diffusion regions 125, 127. The use of a boron diffusion region 125 provides an abrupt junction with the phosphorous diffusion (cathode region 115) in the region of shallow mesa 120. The breakdown junction is formed at this abrupt junction 135. In addition, the boron diffusion regions 125,127 provide a high surface concentration for contacting metals. The path of current I when abrupt junction 135 is in breakdown is indicated at 140. In particular, the current passes from the back of the N type slice and through the abrupt junction 135 formed with the cathode region 115 and boron diffusion region 125. The current path continues under the cathode 115 and through the opening 145 within the cathode 115 and to a cathode contact. When the voltage under the cathode forward biases the cathode-base junction, the device turns on similarly to a PNPN device. The device 100 is protected with glass passivation (not shown) and plated with nickel to provide a low voltage protection device ready for connection in a circuit.

Figure 6:
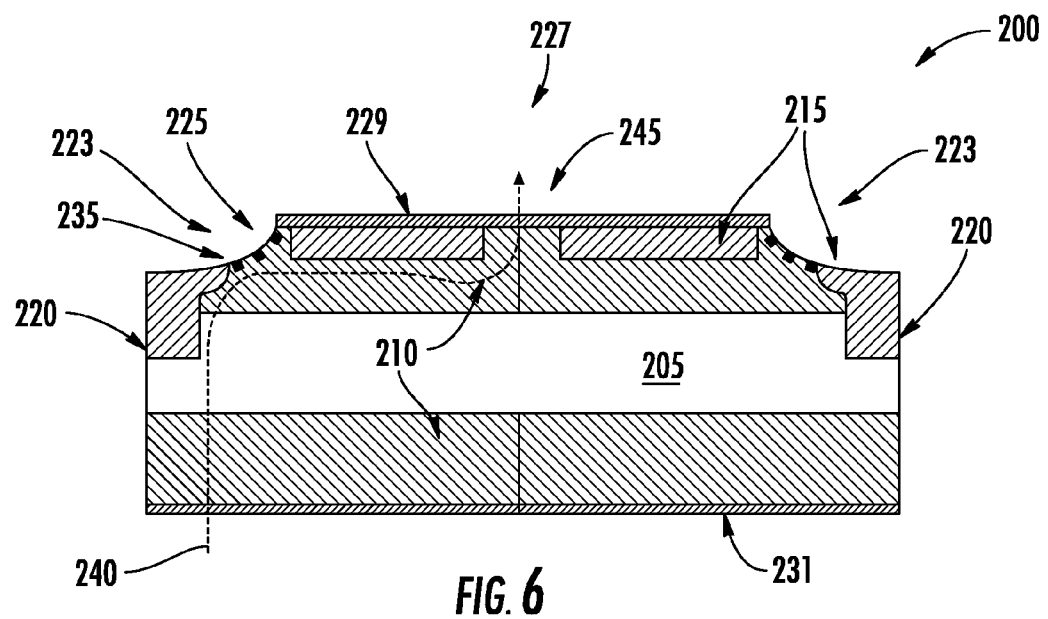
FIG. 6 illustrates an alternative embodiment of a discrete voltage protection device in accordance with the present disclosure.
Figure 6A:
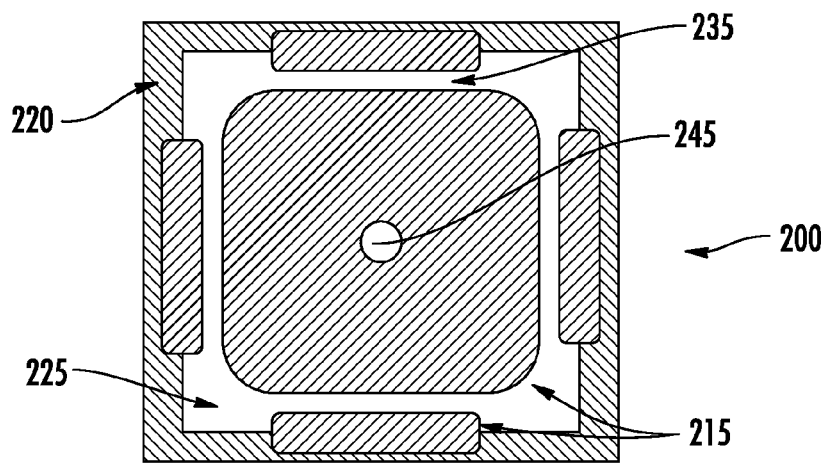
FIG. 6A is a plan view of the discrete low voltage protection device shown in FIG. 6 in accordance with the present disclosure.

FIG. 6 illustrates an alternative embodiment of a discrete voltage protection device 200 in accordance with the present disclosure. The device 200 includes an N type substrate 205 with P type diffusion areas 210. A deep phosphorous diffusion region 220 is formed around the outside of the device to make contact with the N substrate 205 before the p type diffusion areas 210 are formed. The damaged silicon is etched away around the edge of the device 200 after the P type diffusion are formed, creating mesas 223. A selective diffusion process of N type dopant creates cathode diffusion regions 215 in both the main cathode area 227 and in the silicon etched mesas 223. A high concentration of P type diffusion is provided at regions 225. The top and back of the N type slice of substrate 205 is provided with a blanket boron diffusion with a concentration not exceeding the concentration of cathode diffusion regions 215 to both form the low voltage junction 235 and to provide a highly doped surface for contacting a metallization layer. The path of current I when junction 235 is in breakdown is indicated at 240. In particular, the current passes from the P type diffusion 210 through the back of the N type slice or substrate 205 and through the junction 235 formed with the cathode diffusion regions 215 and boron diffusion 225. The current path continues under the cathode 215 and through the hole 245 within the cathode 215 to a cathode contact. FIG. 6A is a plan view of the discrete low voltage PNPN device 200 which illustrates the cathode region 215, deep N+ diffusion 220, high concentration of boron diffusion 225, breakdown region 235 and hole 245. As explained above, the deep N+ diffusion 220 is used to contact the N substrate.

Figure 7:
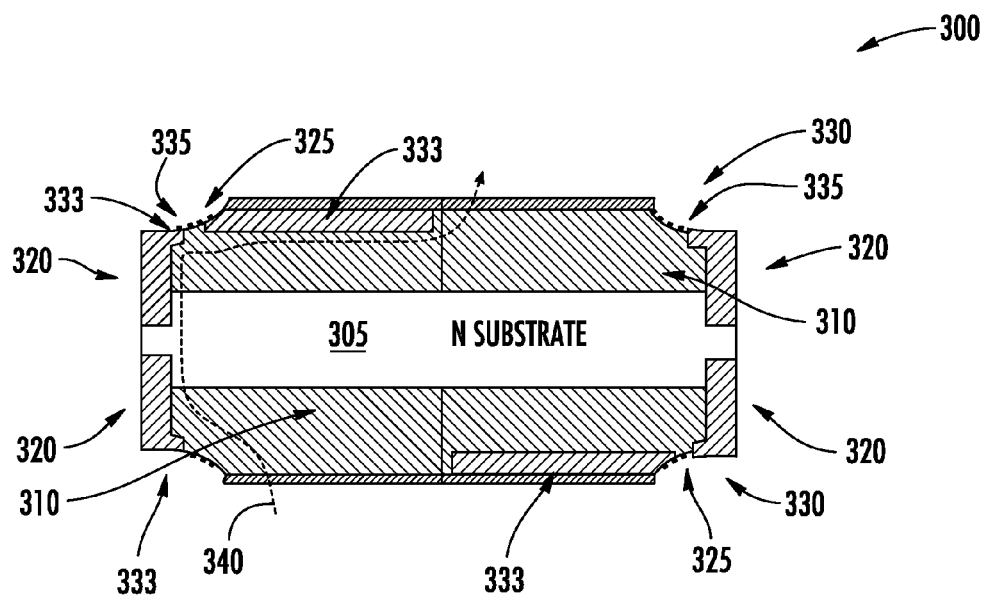
FIG. 7 illustrates an exemplary bi-directional version of the discrete low voltage protection device in accordance with the present disclosure.

The structures illustrated in FIGS. 5 and 6 may be modified to provide conduction or a break-over characteristic in the reverse direction. For example, FIG. 7 illustrates an exemplary bi-directional version of the discrete low voltage protection device 300. An N type substrate 305 has P type diffusion regions 310 on either side of the N type substrate and a deep N type diffusion region 320 provided on the outside of both top and bottom surfaces of the substrate in order to contact the substrate 305. A silicon etch forms mesas 330 on both top and bottom surfaces of low voltage protection device 300. A cathode diffusion region 333 is formed in planar portions of the top and bottom surfaces of low voltage protection device 300, as well as in portions of the mesas 330. A high concentration of P type dopant in the regions 325 located in mesas 330 provides a low breakdown voltage junction 335 adjacent cathode diffusion regions 333. The current path is indicated at 340.

Figure 8:
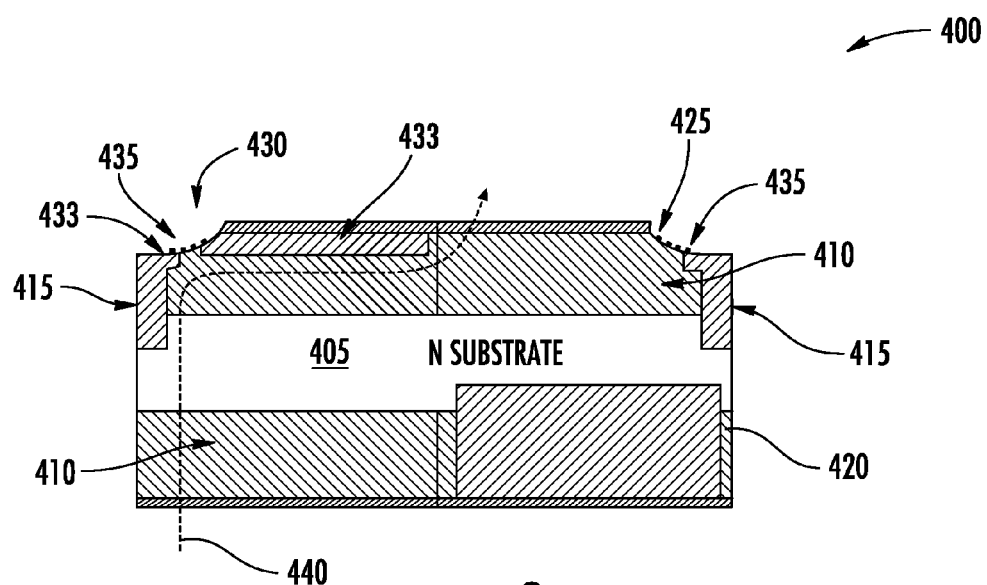
FIG. 8 illustrates an exemplary unidirectional version of the discrete low voltage protection device in accordance with the present disclosure.

FIG. 8 illustrates an exemplary unidirectional version of the discrete low voltage device 400. An N type substrate 405 has P type diffusion regions 410 on either side of the N type substrate 405 and a deep N type diffusion region 415 extending from the outside of the top surface of the low voltage device 400. A silicon etch forms mesas 430 on the periphery of the top surface of the low voltage device 400. A cathode diffusion region 433 is formed in planar portions of the top surface of low voltage protection device 400, as well as in portions of the mesas 430. A deep, wide N type diffusion region 420 contacts the substrate 405 to form a diode. The wide N type diffusion region 420 extends from the opposite side of the low voltage device 400 from which the mesas 430 are formed. Regions 425 are formed by diffusing a high concentration of P type dopant in mesa regions 430. At the junction with cathode diffusion regions 433, the regions 425 provide a low breakdown voltage junction 435.

While the present invention has been disclosed with reference to certain embodiments, numerous modifications, alterations and changes to the described embodiments are possible without departing from the sphere and scope of the present invention.

What is claimed is:

1. A low voltage protection device that includes a silicon substrate, comprising:

an inner layer of a first dopant type;

a first outer layer of a second dopant type disposed adjacent a first surface of the inner layer;

a second outer layer of the second dopant type disposed adjacent a second surface of the inner layer opposite the first surface; and a first mesa region disposed in a peripheral region of a first side of the low voltage protection device, the first mesa region comprising:

a first area that includes a peripheral portion of a cathode of the low voltage protection device, the cathode formed by diffusing a high concentration of dopant species of the first type on a first surface of the silicon substrate; and a second area comprising a high concentration of diffused dopant species of the second type.

2. The device of claim 1, wherein the inner layer and first and second outer layers comprise an N type region and first and second P type regions, respectively.

3. The device of claim 1, further comprising a deep diffusion region comprising dopant species of the first type, the deep diffusion region extending from a surface of the first mesa region to the inner layer of the first dopant type.

4. The device of claim 1, wherein a central region of the cathode comprises an opening wherein a first portion of the first outer layer of the second dopant type extends through the opening.

5. The device of claim 1, further comprising a back layer disposed on a second side of the device opposite the first side, the back layer containing a high concentration of diffused dopant species of the second type.

6. The device of claim 1, further comprising a second mesa region adjacent to the first mesa region, a lower portion of the second mesa region extending into the inner layer of the first dopant type.

7. The device of claim 6, the first mesa region comprising a shallow mesa and the second mesa region comprising a deep mesa.

8. The device of claim 6, the cathode extending over at least a portion of a surface of both the first and second mesa regions, wherein the cathode contacts the inner layer of the first dopant type.

9. The device of claim 1, wherein the device comprises a breakdown diode whose breakdown region is defined by an interface of the first and second areas of the first mesa region.

10. The device of claim 2, wherein a thickness of the P type regions is about 10-100 μm.

11. The device of claim 3, wherein the first mesa region is disposed circumferentially around a central portion of the cathode, and wherein the peripheral portion of the cathode includes multiple regions that define multiple breakdown regions.

12. The device of claim 1, wherein the device comprises a bi-directional device, wherein a second cathode is disposed on a second surface of the silicon substrate.

13. The device of claim 1, wherein the device is passivated with a glass material.

14. A low voltage PNPN protection device, comprising:

an N doped silicon slice;

a first P doped layer defining a first interface with the N doped silicon slice;

a second P doped layer defining a second interface with the N-doped silicon slice opposite the first interface;

a cathode disposed on a first side of the device over a portion of an outer surface of the first p doped layer; and a first mesa disposed on the first side of the device, wherein a surface of the mesa extends into the N-doped silicon slice, and wherein the first mesa includes a P doped region and an N doped region that define a breakdown junction of a breakdown diode.

15. The device of claim 14, wherein the P doped region and N doped region are formed by diffusion.

16. The device of claim 14, further comprising a second mesa that overlaps the first mesa, the second mesa being deeper than the first mesa, wherein the second mesa includes an additional N doped region that extends into the N doped silicon slice.

\* \* \* \* \*